United States Patent [19]

Lagowski

[11] Patent Number: 5,177,351

[45] Date of Patent: Jan. 5, 1993

[54] METHOD AND APPARATUS FOR DETERMINING THE MINORITY CARRIER DIFFUSION LENGTH FROM LINEAR CONSTANT PHOTON FLUX PHOTOVOLTAGE MEASUREMENTS

[76] Inventor: Jacek J. Lagowski, 11504 Norval Pl., Tampa, Fla. 33617

[21] Appl. No.: 616,393

[22] Filed: Nov. 21, 1990

Related U.S. Application Data

[63] Continuation-in-part of Ser. No. 235,305, Aug. 23, 1988, Pat. No. 5,025,145.

[51] Int. Cl.$^5$ ............................................. H01J 40/14
[52] U.S. Cl. .................................. 250/215; 324/158 P
[58] Field of Search .............. 250/211 R, 211 J, 21 S, 250/227.11; 324/158 R, 158 D, 158 T, 158 P

[56] References Cited

U.S. PATENT DOCUMENTS

| | | | |
|---|---|---|---|
| 4,126,380 | 11/1978 | Borm | 324/158 P |
| 4,333,051 | 6/1982 | Goodman | 324/158 |
| 4,567,431 | 1/1986 | Goodman | 324/158 |
| 4,598,249 | 7/1986 | Goodman et al. | |
| 5,018,865 | 5/1991 | Ferrell et al. | 250/227.11 |

OTHER PUBLICATIONS

Goodman, "A Method for the Measurement of Short Minority Carrier Diffusion Lengths in Semiconductors", *J. Appl. Physics*, 33:13, Dec., 1961, pp. 2250–2252.
Goodman, ASTM Standard F-391, 1978, pp. 770–775.
Dmitruk et al., "Investigation of Surface Recombination on Epitaxial GaAs Films," *Phys. Stat. Sol.* (a) 20 53, 1973, pp. 53–63.
Luke et al., "A Chemical/Microwave Technique for the Measurement of Bulk Minority Carrier Lifetime in Silicon Wafers," *J. Electrochem. So.*, Apr., 1988, pp. 957–961.
Moss, "Photovoltaic and Photoconductive Theory Applied to InSb," *J. Electronics and Control*, 1:126 (1955), pp. 126–133.
Phillips, "Interpretation of Steady-State Surface Photovoltage Measurements in Epitaxial Semiconductor Layers", *Solid State Electronics*, 15:1097 (1972), pp. 1097–1102.
Choo et al., "Bulk Trapping Effect on Corner Diffusion Length as Determined by the Surface Photovoltage Method: Theory," *Solid State Electronics Perogamon Press*, 13:609 (1970), pp. 609–617.
Goodman et al., "Silicon Wafer Process Evaluation Using Minority Carrier Diffusion Length Measurement by the SPV Method", *RCA Review*, 44:326 (1983), pp. 326–341.
Verkuil, "A Simple, Low Cost, Non-Contact Method of Measuring Bulk Minority Carrier Diffusion Lengths," *The Electrochemical Society*, Extended Abstracts from Spring Meeting, May 1980, Abstract No. 193, pp. 507–513.
Saritas et al., "Diffusion Length Studies in Silicon by the Surface Photovoltage Method", *Solid State Electronics*, 31:5, pp. 835–841 (1988).
Chu et al., "A comparison of Carrier Lifetime Measurements by Photo-Conductive Decay and Surface Methods", *J. Appl. Phys.* 49:2996 (May 1978), pp. 2996–2997.
Saritas et al., "Comparison of Minority-Carrier Diffusion Lengths Measurements in Silicon by the Photo-Conductive Decay and Surface Photovoltage Methods," *J. Appl. Physics*, 63:9 (May 1988), pp. 4561–4567.
Lagowski, "Electronic Characteristics of Real CdS Surfaces", *Surface Science*, 29:213 (1972), pp. 213–229.

*Primary Examiner*—David C. Nelms
*Attorney, Agent, or Firm*—Fish & Richardson

[57] ABSTRACT

A device for measuring photoinduced electrical properties at a semiconductor sample surface. The device includes an analysis probe having a means for directing a light beam to a defined portion of a semiconductor substrate surface. A probe electrode is provided for detecting a photo-induced electrical signal from the defined portion of the semiconductor substrate, and a light blocking means is carried by the probe for substantially blocking stray light from the defined portion of the substrate surface. A positioning means for positioning the semiconductor and device with respect to each other for measurement of the photo-induced electrical property at a desired defined portion of the semiconductor substrate surface. The positioning means may be adapted to position respectively the wafer and probe without contact between the wafer and probe and to position the wafer with respect to a chuck without contacting the chuck.

29 Claims, 10 Drawing Sheets

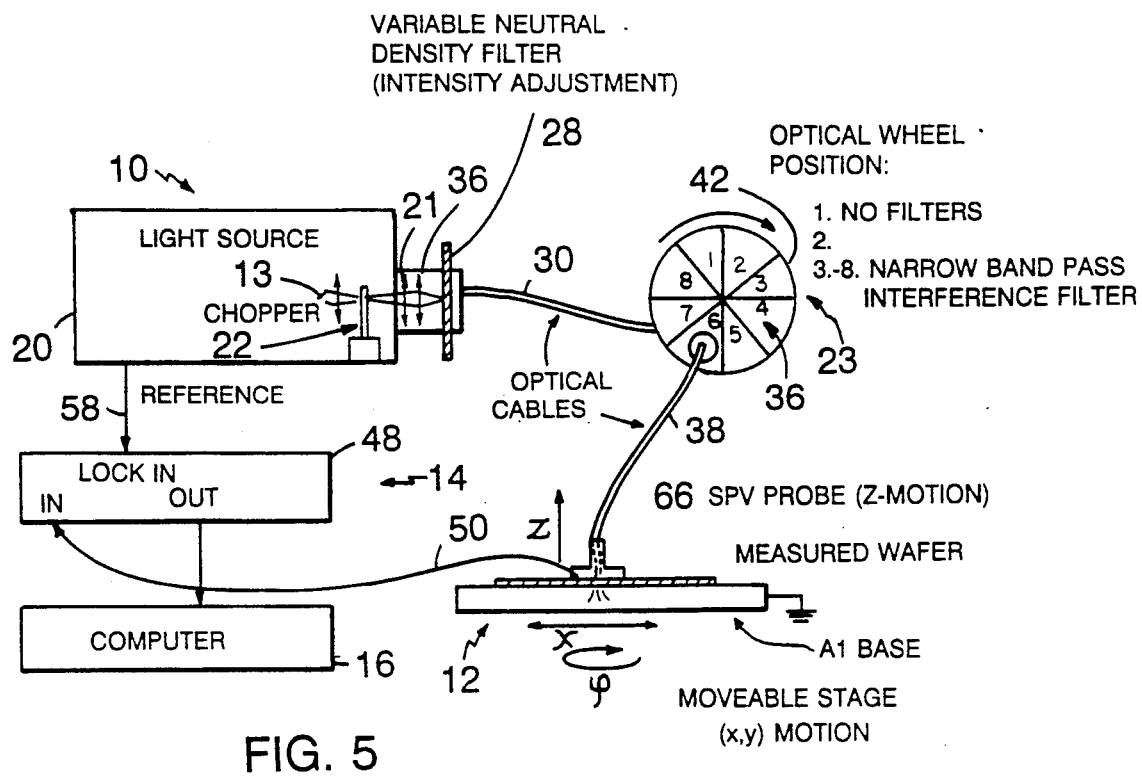
FIG. 5
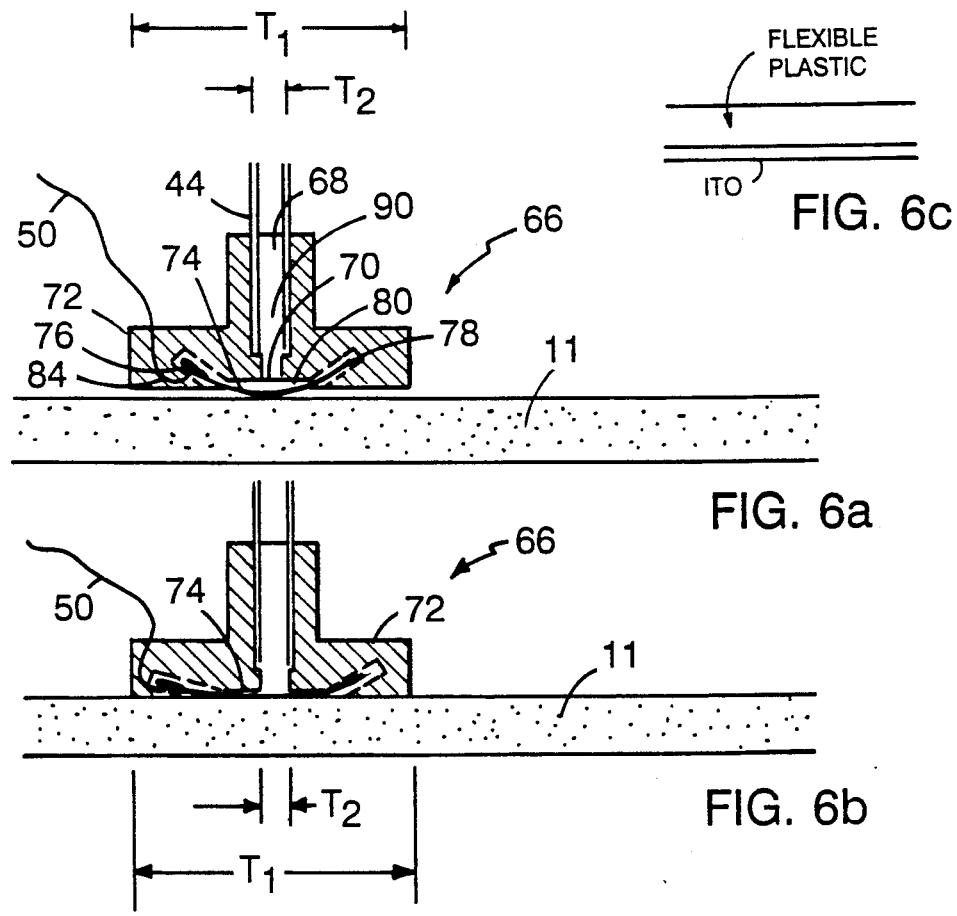
FIG. 6a
FIG. 6b
FIG. 6c

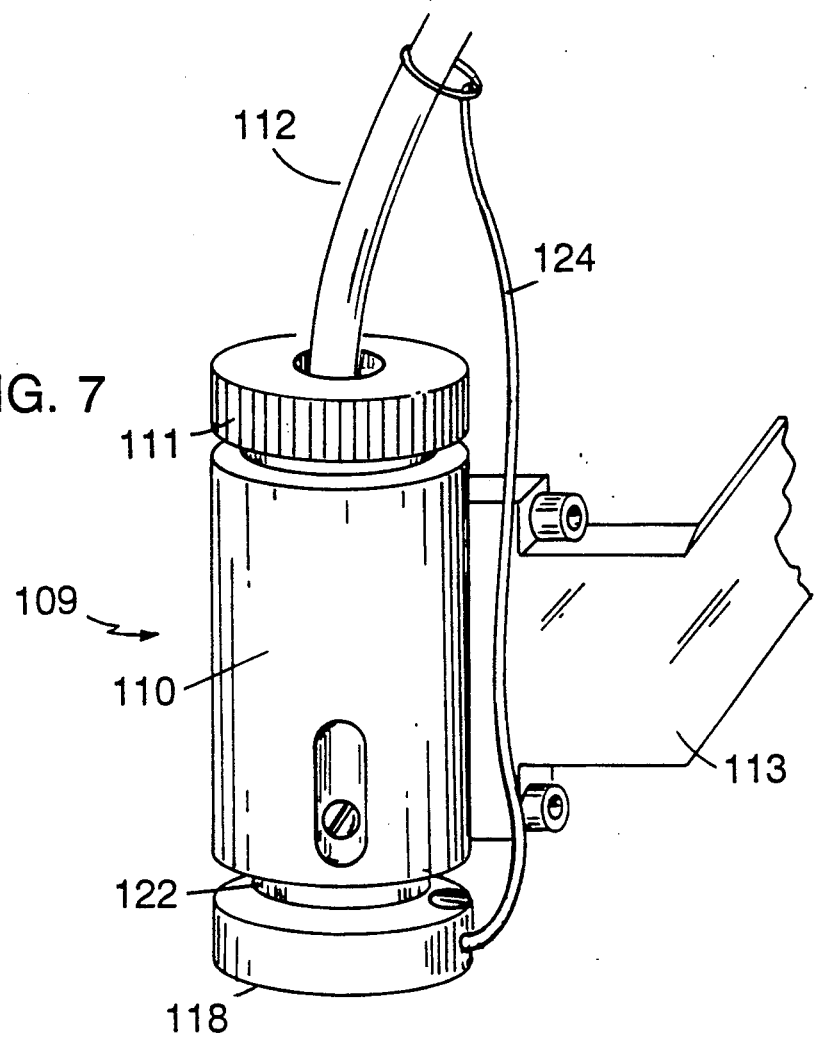
FIG. 7
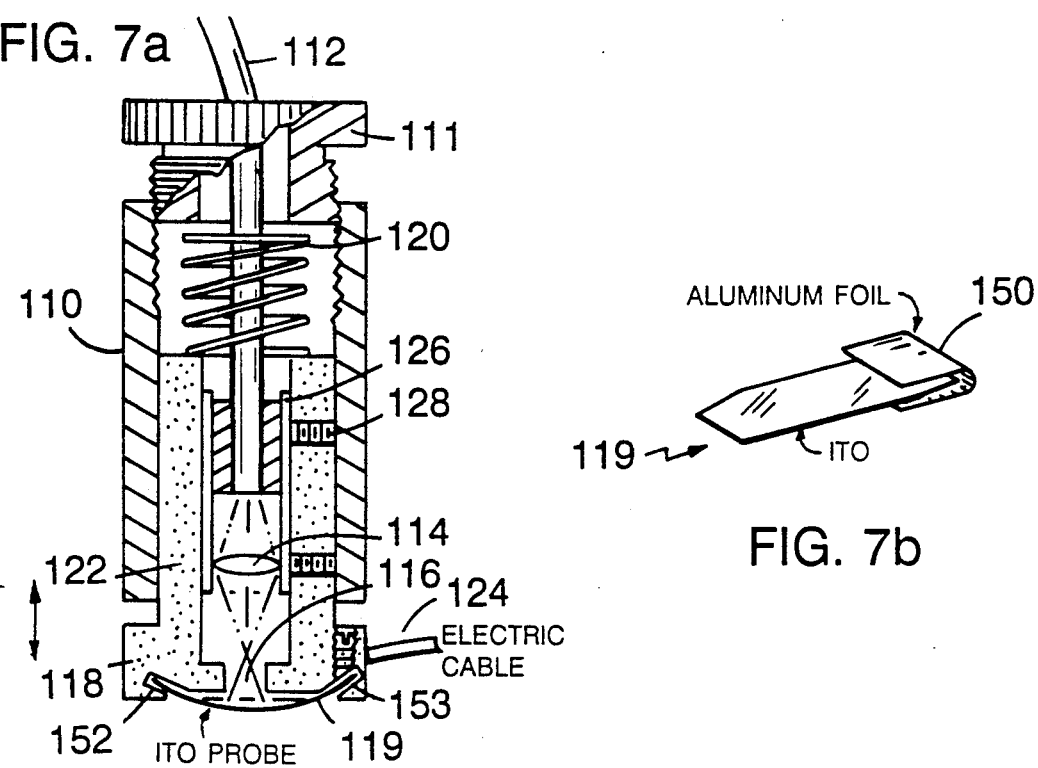
FIG. 7a
FIG. 7b

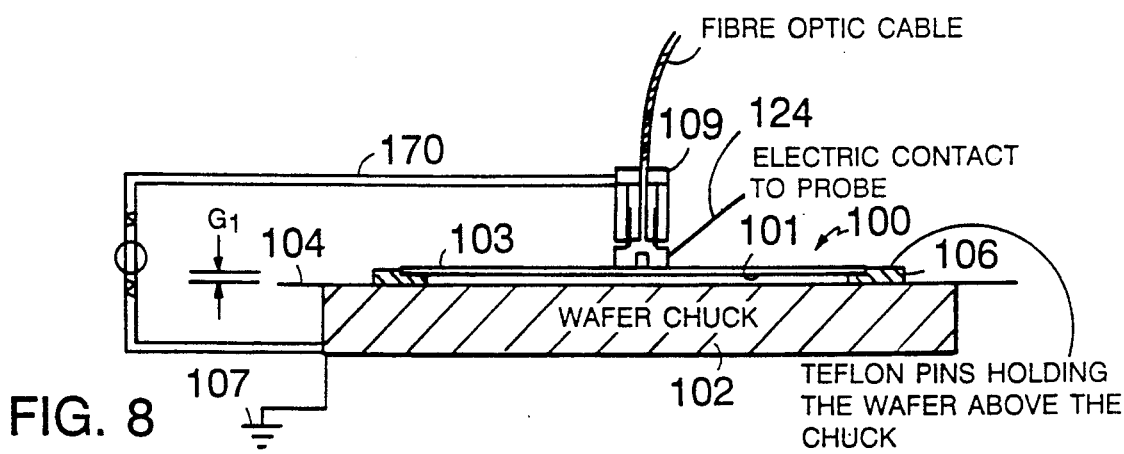
FIG. 8
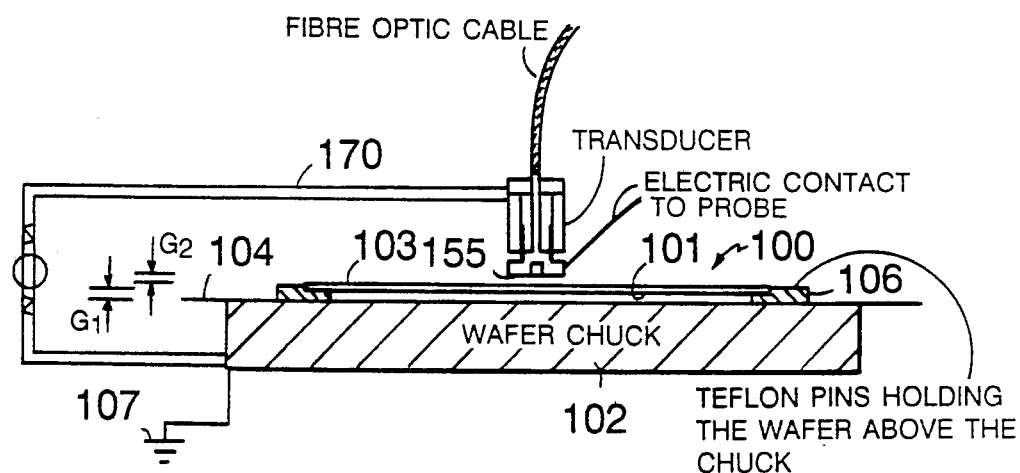
FIG. 9
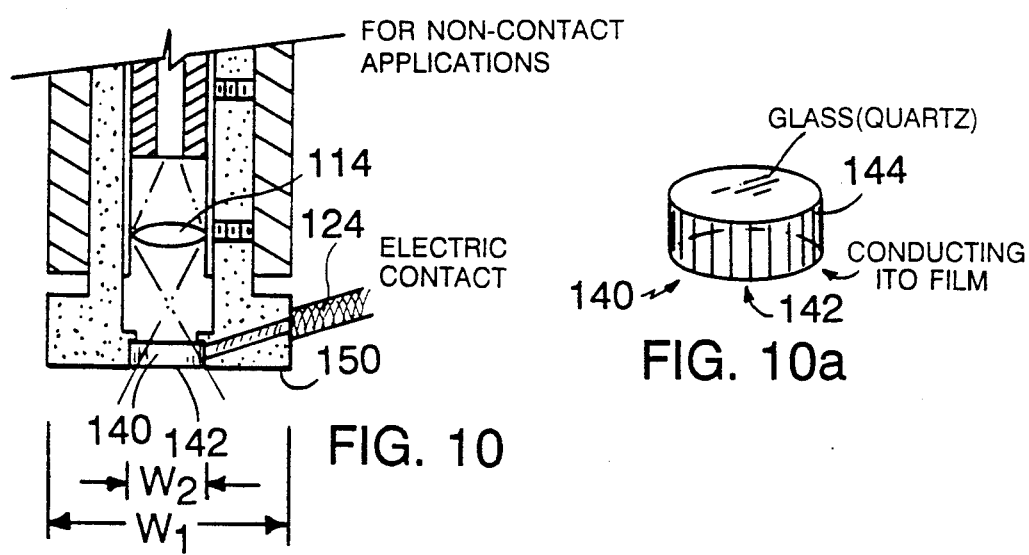
FIG. 10
FIG. 10a

METHOD AND APPARATUS FOR DETERMINING THE MINORITY CARRIER DIFFUSION LENGTH FROM LINEAR CONSTANT PHOTON FLUX PHOTOVOLTAGE MEASUREMENTS

CROSS REFERENCE

This application is a continuation-in-part of U.S. Ser. No. 235,305 filed Aug. 23, 1988, now U.S. Pat. No. 5,025,145.

INTRODUCTION

This invention relates to the measurement of the minority carrier diffusion length of a semiconductor sample to evaluate the contaminant impurities which reduce the carrier lifetime.

Semiconductor materials and especially Silicon (Si), and Gallium Arsenide (GaAs) have become essential to the electronics industry for the production of electronic and optoelectronic devices and corresponding integrated circuits (IC's). To assure the high manufacturing yield and the device reliability, however, it is a requirement that the production of semiconductor wafers and their processing during IC manufacturing be carried out under conditions meant to minimize the introduction of heavy metal contaminants which are known to degrade the semiconductor devices by introducing lifetime killing recombination centers. It is necessary, therefore, for a quality control measure of contaminant impurity both before processing, to establish that wafers are acceptably pure, and after processing to ensure that undue, debilitating contamination has not occurred. Since many measurements may be necessary both due to the need for measurement at various positions on a single wafer and the analysis of wafers after different processing steps and further, that the results of these analyses are indicative of the reliability of semiconductor devices formed or to be formed, the testing method must be both rapid and accurate.

One of the most common methods for determination of contamination measures a property of the semiconductor known as the minority carrier diffusion length (L) which indicates the effective distance that excess carriers diffuse through a semiconductor during their lifetime. Excess carriers in a semiconductor tend to redistribute due to a diffusion phenomenon which equalizes the carrier concentration. This diffusion process is controlled by the mobility of the excess minority carriers ($\mu$) and their lifetime ($\tau$). The diffusion length (L) is a parameter combining these two factors, and in the simplest case has the form:

$$L = \sqrt{\frac{kT}{q} \mu \tau} \quad (1)$$

Where k the is Boltzman's constant, T is the temperature and q is the elementary charge Heavy metal contaminants in silicon wafers act as recombination centers which reduce the minority carrier lifetime $\tau$. By measuring the diffusion length, the concentration of the contaminants may then be determined.

A common, nondestructive technique for measuring L takes advantage of the process by which light impinging upon a semiconductor surface may be absorbed and produce excess carriers (holes and electrons) if the energy of the incident photons, h$\gamma$ is above the semiconductor band gap $E_g$. As a result of the photogeneration and diffusion process, a certain number of electron-hole pairs reach the proximity of the surface and become separated by the electric field of the surface-space charge region to produce a surface photovoltage (SPV). Measurement of the photovoltage can thus be used for the determination of the minority carrier diffusion length L, and in turn for the determination of the lifetime $\tau$, and the concentration, $N_c$, of the heavy metal contaminants where $N_c \cdot \Psi t^{-1}$ (and C is the constant depending on the individual impurity).

Prior methods for determining the diffusion length from the surface photovoltage rely on a procedure known as the "constant magnitude surface photovoltage," (CMSPV) method, the principles of which were proposed by Goodman in "A Method for the Measurement of Short Minority Carrier Diffusion Lengths in Semiconductors," *J. Appl. Phys.* Vol. 33, p. 2750, 1961; subsequently adopted as the ASTM standard ANSI/ASTM F-391-78, p. 770, 1976 and discussed in U.S. Pat. No. 4,337,051. The characteristic steps of this prior art approach are to measure the photovoltage and the photon flux at several wavelengths ($\lambda_i$) (corresponding to photon energies (h$\gamma_i$)), vary the magnitude of the photovoltage by adjustment of the incident light intensity or photon flux ($\phi$) to produce a constant photovoltage, measure the corresponding photon fluxes, and then plot the photon flux values versus the reciprocal absorption coefficient $\alpha^{-1}$ of the semiconductor sample at the various photon energies. This plot is then linearly extrapolated to determine the intercept along the reciprocal absorption coefficient axis to obtain the minority carrier diffusion length L (i.e., $L = -\alpha^{-1}$ where $I = 0$). Thus, in the CMSPV method the diffusion length is in fact determined not from the SPV values ($V_1 \ldots V_i$) measured for different incident photon energies (h$\gamma_1 \ldots$ h$\gamma_i$) but from the corresponding values of the photon fluxes ($\phi_1 \ldots \phi_i$) required to maintain the constant magnitude SPV signal $V_1 = V_2 = V_3 \ldots V_i$ for all photon energies measured.

From a theoretical viewpoint, this prior art procedure overcomes the lack of an explicit formula relating the photovoltage with the absorption coefficient, and the diffusion length by taking advantage of the steady state relationship between the excess minority carrier density (i.e. electron density, $\Delta n_s$, for a P-type semiconductor or hole density, $\Delta p_s$, for N-type semiconductor) at the proximity of the illuminated surface of a sufficiently thick ($d \gg \alpha^{-1}$) semiconductor wafer. This relationship is in fact readily available from theoretical treatment, described by namely, $$\Delta n_s = \frac{\Phi(1-R)}{D/L + S} \frac{1}{1 + \alpha^{-1} L^{-1}} \quad (2)$$

where R is the reflectivity, D is the minority carrier diffusivity and S is the surface recombination velocity. The excess carrier density, $\Delta n_s$ is dependent upon the photon energy, h$\gamma$, of the impinging light due to the strong dependence of the absorption coefficient, $\alpha$ on photon energy for the case where the photon energy is greater than or equal to the band gap, h $> E_g$.

The prior art method then assumes that a surface photovoltage, V, is a monotonically increasing function of the excess carrier density, $\Delta n_s$, i.e., $V = f(\Delta n_s)$, and concludes that the constant surface photovoltage V=const. corresponds to carrier density being constant. $\Delta n_s$=const. or that:

$$V = \text{const} \rightarrow \Delta n_s = \text{const.} \quad (3)$$

Employing relationship (2), condition (3) is shown to yield:

$$\Phi_{(V=\text{const})} = C_1(1 + \alpha^{-1}L^{-1}) \quad (4)$$

where $C_1$ is a constant parameter practically independent of absorption coefficient $\alpha$, and it is this expression that is then used for determining the value of diffusion length L in the CMSPV method.

Unfortunately, however, the CMSPV method is prone to error in the assumption that the photovoltage is always a monotomically increasing function of $\Delta n_s$. Cases have been reported whereby surface photovoltage decreased with increasing carrier density, $\Delta n_s$, due to various surface effects. Furthermore, the parameters S, D and L in expression (2) which relates carrier density $\Delta n_s$ and absorption coefficient $\alpha^{-1}$ can become themselves functions of the photon flux at higher fluxes, thereby pertubing the theoretical steady state expression. Both of these phenomena invalidate the CMSPV assumption and lead potentially to measurement error.

Furthermore, the CMSPV technique is a multistep procedure which includes finding constant voltage and corresponding photon flux for each measurement at each photon energy, thereby requiring considerable time even when a servo-mechanism is employed to control the photon flux in response to the measured photovoltage or considerable effort of the operator in the manual measurement mode. Finally, the prior art method for measuring SPV requires the inconvenience of making photovoltage measurements while shielding the measuring stage to avoid errors in the determined diffusion length value and noise effects introduced to the measurements by ambient light.

It is, therefore, the object of the present invention, to provide a method and apparatus for a more accurate, reliable, simpler and faster determination of the minority carrier diffusion length.

SUMMARY OF THE INVENTION

The invention features a device and method for measuring photoinduced electrical properties at a semiconductor sample surface. An analysis probe has a means for directing a light beam to a defined portion of a semiconductor substrate surface. A probe electrode detects a photo-induced electrical signal from the defined portion of the semiconductor substrate. A light blocking means, carried by the probe substantially blocks stray light from the defined portion of the substrate surface. A positioning means is provided for positioning the semiconductor and device with respect to each other for measurement of said photo-induced electrical property at a desired defined portion of said semiconductor substrate surface.

Particular embodiments may include the following. The positioning means is adapted to position respectively the wafer and probe without contact between the wafer and probe. The positioning means is adapted to position the wafer with respect to a chuck without contacting the chuck. The following condition is satisfied:

$$(S_p/d_{pw}) << (S_w/d_{wc})$$

where:
$S_p$—probe surface area
$d_{pw}$—distance between probe and wafer
$S_w$—surface area of the wafer
$d_{wc}$—distance between wafer and chuck
(Sp/dpw) is at least one order of magnitude smaller than (Sw/dwc). The probe includes a ground electrode adapted to face the substrate surface. The surface area of the ground electrode is about 10 times or more greater than the surface area of the probe electrode. The chuck is nonconducting. The wafer is positioned above a chuck having a light absorbing surface.

Particular embodiments may also include the following. The light blocking means has a light blocking surface adjacent the wafer and the light blocking surface is smaller than the wafer. The light blocking surface facing the wafer is symmetrically disposed with respect to the light beam produced by the probe. The width of the light blocking surface is at least about three times the width of the light beam impinged upon the surface. The positioning means is adapted to position respectively the wafer and probe without contact between the wafer and probe and the position of the probe above the wafer is less than about 2 times or less than the width of the light beam impinged upon the surface. The electrode is a rigid dielectric member having a conductive coating facing the semiconductor. The dielectric member is quartz. A biased housing is provided for soft contact of the probe to the wafer surface.

An advantage of the invention is a light blocking probe for measurement of photo-induced electrical properties such as photovoltage or photocapacitance, which may be used in various measurement modes, such as without contact of the wafer chuck to the back of the wafer and without contact of the probe to the front surface of the wafer.

DESCRIPTION OF THE PREFERRED EMBODIMENT

Brief Description of the Figures

FIG. 5 is a block schematic of a diffusion length measuring system.

FIG. 6a is a detailed cutaway view of the measurement probe in a position just above a sample surface.

FIG. 6b is a detailed cutaway view of the measured probe positioned at a sample surface as it would be during a photovoltage measurement.

FIG. 6c is a detailed expanded view of a flexible electrode.

FIGS. 7 and 7a are perspective and cross-section schematics, respectively, of a light blocking probe for enhanced soft-contact surface photo-voltage measurements; while FIG. 7b is a perspective schematic of the electrode of the light blocking probe in FIG. 7.

FIG. 8 is a partial cross-section schematic of photoelectrical measurement in a non-contact arrangement of a wafer and chuck, using a light-blocking probe.

FIG. 9 is a cross-section schematic of photoelectrical measurement in a non-contact arrangement of a wafer and a chuck and a wafer and light-blocking probe.

FIG. 10 is a schematic of a light-blocking probe for non-contact measurements as in FIG. 9, while FIG. 10a is a perspective schematic of the electrode of the light-blocking probe in FIG. 10.

GENERAL DESCRIPTION

A light blocking probe for measurement of photoinduced electrical properties is provided that may be used in various measurement modes such as with the probe in contact with the wafer surface or with the probe positioned above and not in contact with the wafer surface. The wafer may also be positioned above a wafer chuck.

Preferably, in the measurement an induced photovoltage is first measured for different photon fluxes to assure linearity of photovoltage versus photon flux. Next, using light with constant photon flux of the value within the linear photovoltage range, the photovoltage is measured for a series of selected photon energies and those photovoltage values which monotonically increase with the photon energy are plotted as a function of the reciprocal absorption coefficient corresponding to the given photon energies. The minority carrier diffusion length is determined by extrapolating to find the reciprocal absorption coefficient at zero photovoltage. The values outside of the monotonical range are rejected from the analysis, which eliminates interference from the surface effects and assures an accurate determination of the diffusion length. This method therefore determines diffusion length directly from the surface photovoltage measured in the different incident photon energies.

The linear photovoltage constant photon flux approach of the present invention is an improvement over constant magnitude surface photovoltage procedures in that it eliminates measurements of the photon flux and the need for equalizing the magnitude of the SPV signal and is therefore much faster and simpler and thus more suitable for measurements on many wafers or for several measurements at different positions on each wafer as is required for a meaningful determination of the contamination on semiconductor integrated circuits processing lines. Furthermore, it reduces or eliminates the danger of inaccuracies and errors encountered due to surfaces or light intensity effects in diffusion length measurements.

DETAILED DESCRIPTION

Figure 1A:
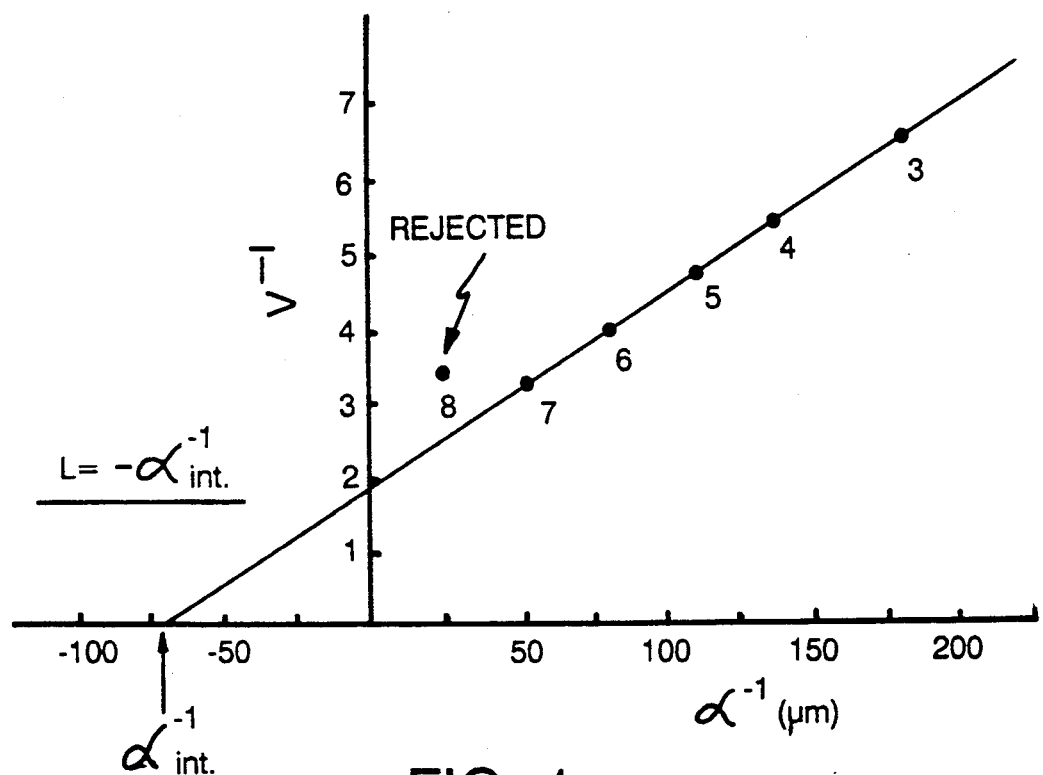
FIG. 1a is a plot of the reciprocal of the linear constant photon flux surface photovoltage as a function of the reciprocal absorption coefficient according to the invention.

Referring to FIG. 1a, a plot of the reciprocal photovoltage as a function of the reciprocal absorption coefficient (corresponding to a series of photon energy or wavelengths) is given by which the minority carrier diffusion length L may be determined by extrapolation. Point eight which does not satisfy the monotonically increasing criterion (where, for example, $V_n < V_{n+1}$ see also FIG. 1d) is rejected from the computation of the diffusion length L.

The prior art methods, such as the CMSPV method, allow for the possibility of error from two sources. First the intensity of impinging light for the selected photovoltage may be outside of a linear surface photovoltage range. Secondly, photovoltage may not be a monotomically increasing function of photon energy due to surface effects.

Figure 1B:
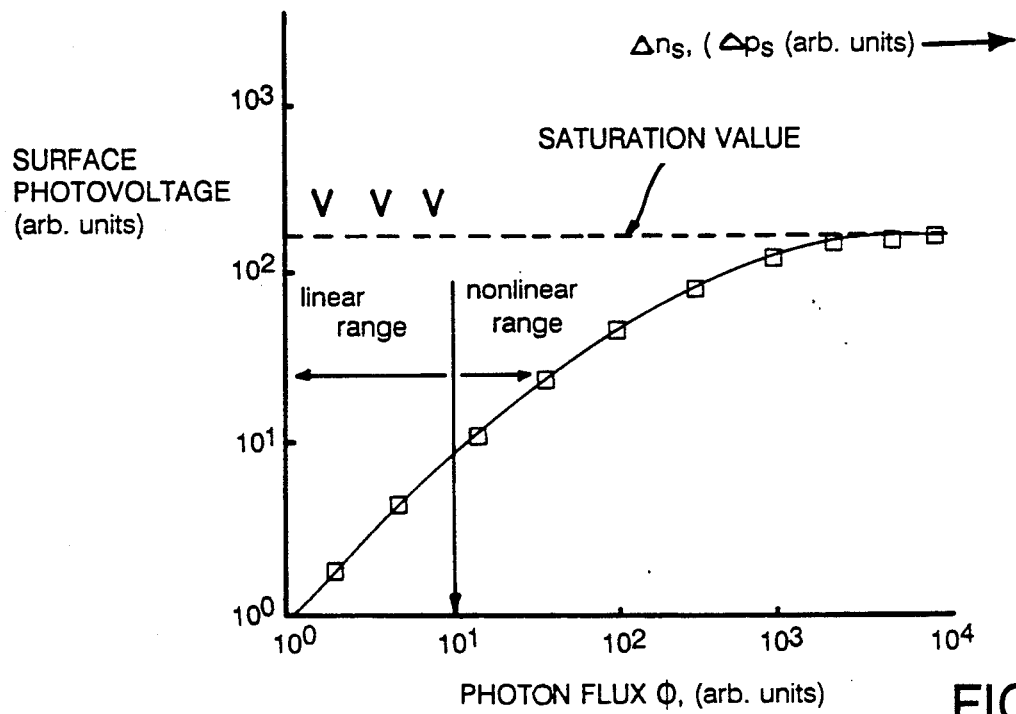
FIG. 1b is a plot of the surface photovoltage as a function of photon flux and the excess carrier density for constant photon energy.

The validity range of the expression (2) and corresponding expression (4) must be in fact limited to low excitation densities and thus low values of photon flux $\phi$. For higher excitation densities the parameters S, L and D become dependent on the photon flux $\phi$. Furthermore, the diffusion process can change from unipolar to the ambipolar diffusion, changing the meaning and values of the diffusion length, L. For high photon flux the value of the photovoltage also tends to saturate, approaching a value, $V_s$, equal to a sum of the dark value of the surface potential barrier, $V_o$, and the Dember potential, $V_d$. This behavior is shown in FIG. 1b as the curve of surface photovoltage versus photon flux tends to approach the saturation value $V_s$ at higher fluxes. We realize that the values of the diffusion length L determined by surface photovoltage methods depend on the illumination intensity and furthermore, for the CMSPV method depend on the selected value of the surface photovoltage. In order to eliminate the interfering effects it is necessary to perform surface photovoltage measurements at sufficiently low illumination intensity and to carry out tests proving that illumination does not affect the measurement parameters. Furthermore, the assumption that for constant photovoltage, the excess carrier density $\Delta n_s$ is also constant, expression (3), which is fundamental for the accuracy of the constant magnitude photovoltage methods, is not always valid since the same values of the photovoltage may correspond to different values of the carrier density $\Delta n_s$ as will now be shown.

Figure 1C:
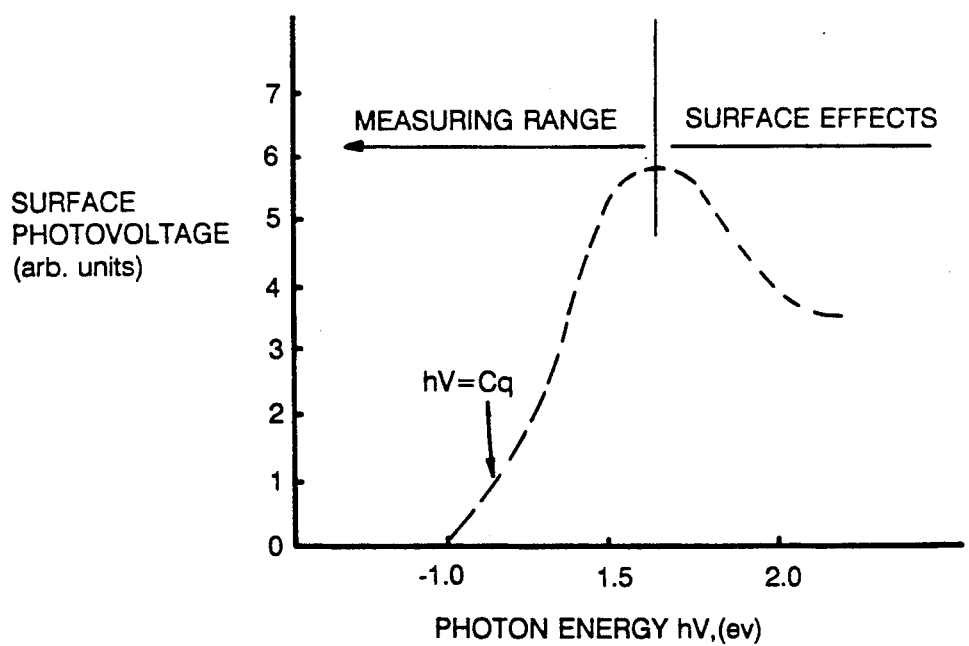
FIG. 1c is a plot of the constant photon flux surface photovoltage as a function of the photon energy showing a monotonical and a nonmonotonical range which is caused by surface effects.

Referring to FIG. 1b, the photovoltage always increases monotonically with the excess carrier density $\Delta n_s$ (changed by changing the photon flux, $\phi$) providing that the photon energy is kept constant. However, as is the case in any surface photovoltage diffusion length measurements, when different photon energies are employed the SPV signal may pass through the maximum as shown in FIG. 1c. In this condition, the relation between surface photovoltage and carrier density $\Delta n_s$ is no longer a unique one but rather the same photovoltage may correspond to different values of carrier density. Several phenomena could lead to such a photovoltage maximum such as the Dember effect, surface defects or the contribution from residual photovoltaic effects on the back surfaces or the internal junctions present in a semiconductor sample.

It is thus apparent that the assumption that photovoltage is a monotonic function of the carrier density, $\Delta n_s$ does not guarantee the validity of constant photovoltage methods such as the CMSPV approach. This condition must be supplemented by the additional requirement that photovoltage is also a monotonically increasing function of the photon energy, h$\gamma$. For a reliable determination of diffusion length L, this latter condition must be verified experimentally and used to select the measurement range of photon energy.

The present procedure for determining the diffusion length recognizes all these interfering phenomena and eliminates their contribution by confining the illumination to the low intensity range corresponding to the linear photovoltage range and by limiting the spectral range to regions whereby the photovoltage increases monotonically with the photon energy. Under these conditions a direct relation between surface photovoltage and absorption coefficient may be found as will now be expressed.

The linear SPV condition, simply, $$V = A\phi \tag{5}$$

where A is a constant and V is the photovoltage, combined with a monotonical relationship between photovoltage and photon energy (and thus photovoltage and absorption coefficient $\alpha$) eliminates the need for the photon flux measurements to produce a constant photovoltage. In the low intensity range a direct relationship exists between the surface photovoltage and the excess carrier density that is, $$V = A_2 \Delta n_s \tag{6}$$

Expressions 5, 6 and 2 then lead to the explicit expression for surface photovoltage as a function of diffusion length L, namely $$V = \text{const } \phi_{eff} \frac{\alpha}{1 + \alpha L} \tag{7}$$

(where $\phi_{eff} = \phi(1-R)$ is the effective photon flux). Equation (7) is used in the present invention for determination of diffusion length directly from the constant photon flux, $\phi_{eff}$=const, photovoltage measurement.

Figure 2A:
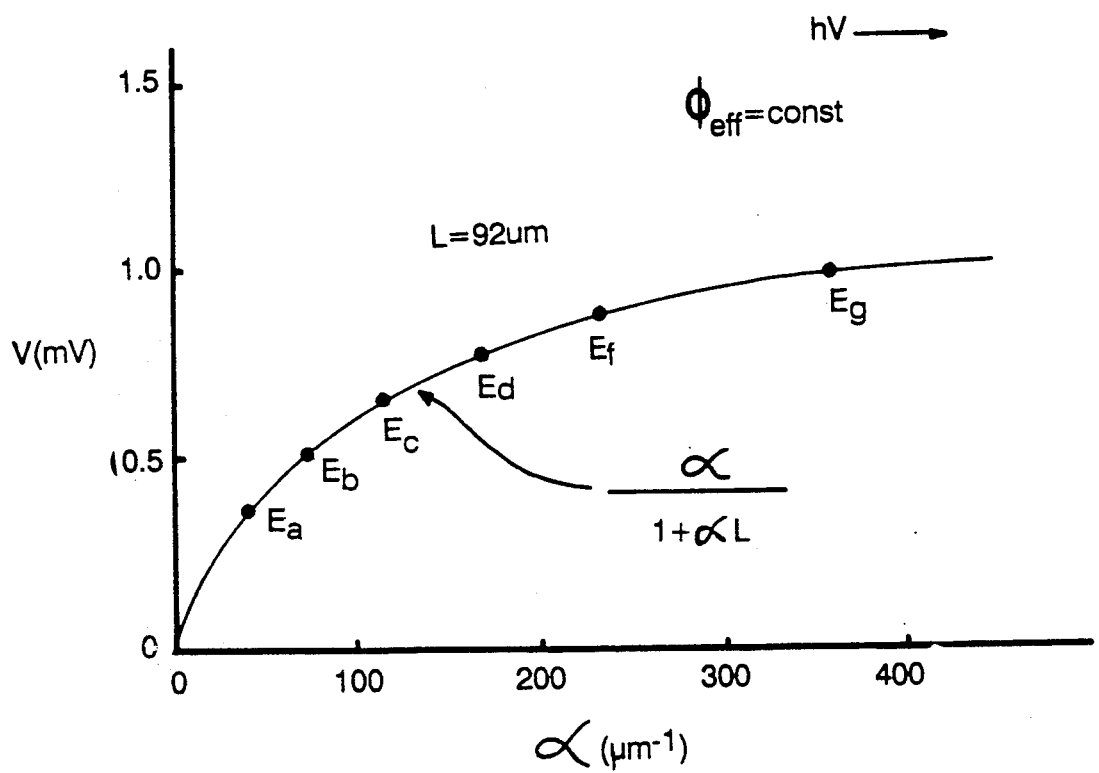
FIG. 2a is a plot of surface photovoltage versus absorption coefficient according to the invention.

In FIG. 2a, the validity of expression (7) is demonstrated. The photovoltage values for an N-type FZ-silicon wafer of known diffusion length, L=92$\mu$m, induced by incident light of photon energies h$\gamma$>E$_g$, (where the effective photon flux at each energy has the same value low enough to ensure that photovoltage versus $\phi$ is in the linear range) are plotted versus absorption coefficient. As is evident from the figure, the experimental values fall properly on the ideal line calculated using expression (7).

Figure 2B:
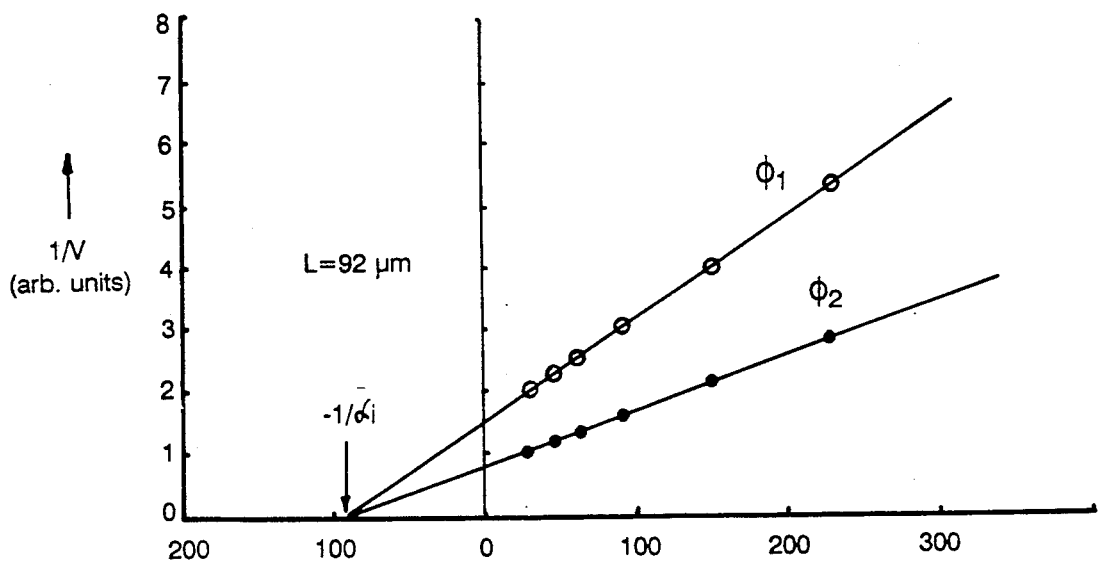
FIG. 2b is a plot of the reciprocal of surface photovoltage versus the reciprocal absorption coefficient according to the invention for two different values of the photon flux ($\phi_2 = 2\phi_1$).
Figure 2C:
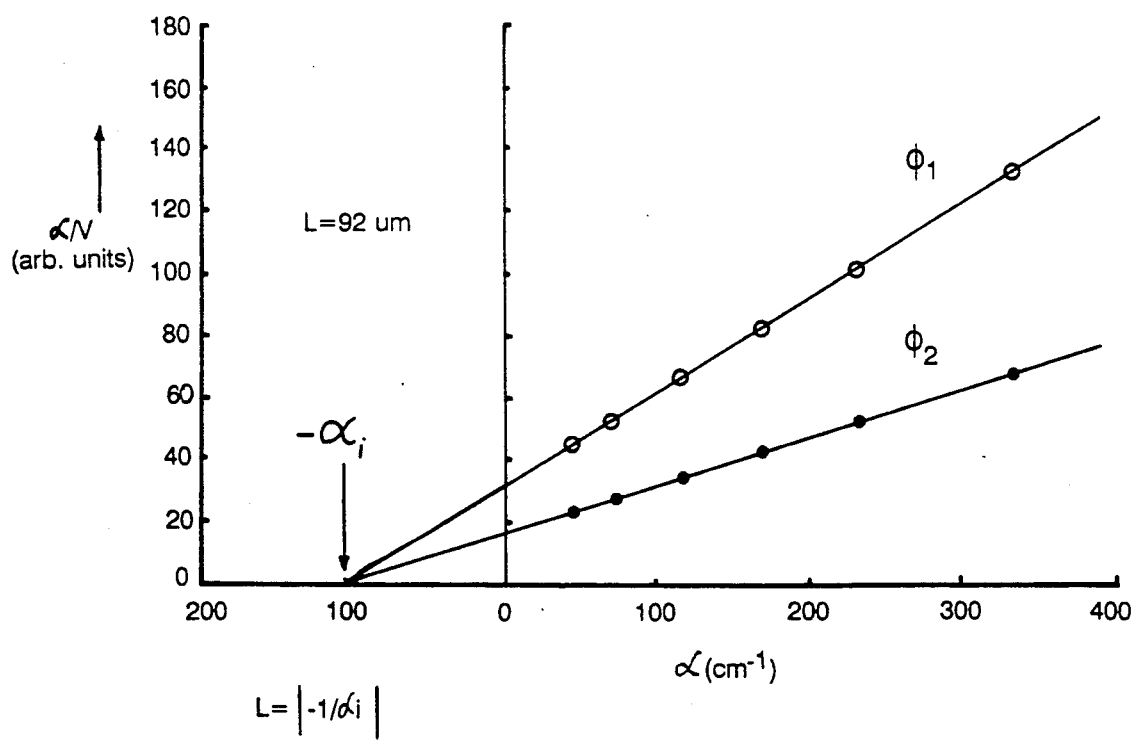
FIG. 2c is a plot of the absorption coefficient divided by photovoltage as a function of the absorption coefficient according to the invention. The photon flux $\phi_2 = 2\phi_1$.

Referring to FIG. 2b and 2c, two methods for calculating the minority carrier diffusion length L employing relation (7) are demonstrated by plots in which the photovoltage is observed at constant photon flux for two values of the photon flux such that photovoltage is a linear function of the flux.

In FIG. 2b, the reciprocal of the induced photovoltage, plotted versus the reciprocal of the absorption coefficient yields the diffusion length L by extrapolation to the absorption coefficient axis as described herein with respect to FIG. 1a. this plot represents the rearrangement of expression (7) where $$V^{-1}/\phi\text{eff} = \text{const} = \text{const} \times (1 + \alpha^{-1}L^{-1}) \tag{8}$$

In FIG. 2c, a plot of absorption coefficient divided by photovoltage, $\alpha$/V versus absorption coefficient $\alpha$ is shown where the diffusion length L is again found by extrapolation as shown which represents the rearrangement of expression (7) where $$\frac{\alpha}{V}\Big|_{\phi_{eff}=cont.} = \text{const.} \times (1 + \alpha L) \tag{9}$$

As can be seen both methods of course, provide the correct value of L, 92$\mu$m. Furthermore, they yield the same L=92 $\mu$m for two different values of photon fluxes $\phi_1$ and $\phi_2$. The method of FIG. 2c provides the convenient advantage over the method of FIG. 2b in that the points of the plot are spread across a greater range of X axis values.

Another aspect of the invention, arising as a consequence of expression (7), allows for verifying, first, that the photon flux selected for measurement is indeed such that the photovoltage is a linear function of flux and, secondly, that the proper values of the absorption coefficient, used in the method for calculating diffusion length L, have been selected. This later concern arises from the fact that several values for an absorption coefficient for a given semiconductor and photon energy may be available in the literature. Selection of an inaccurate value necessarily results in errors in the calculation of the diffusion length, L as discussed in Saritas et al. "Comparison of minority-carrier diffusion length measurements in silicon by the photoconductive decay and surface photovoltage methods", *J. Appl. Phys.* 63(9), 1988.

Figure 3:
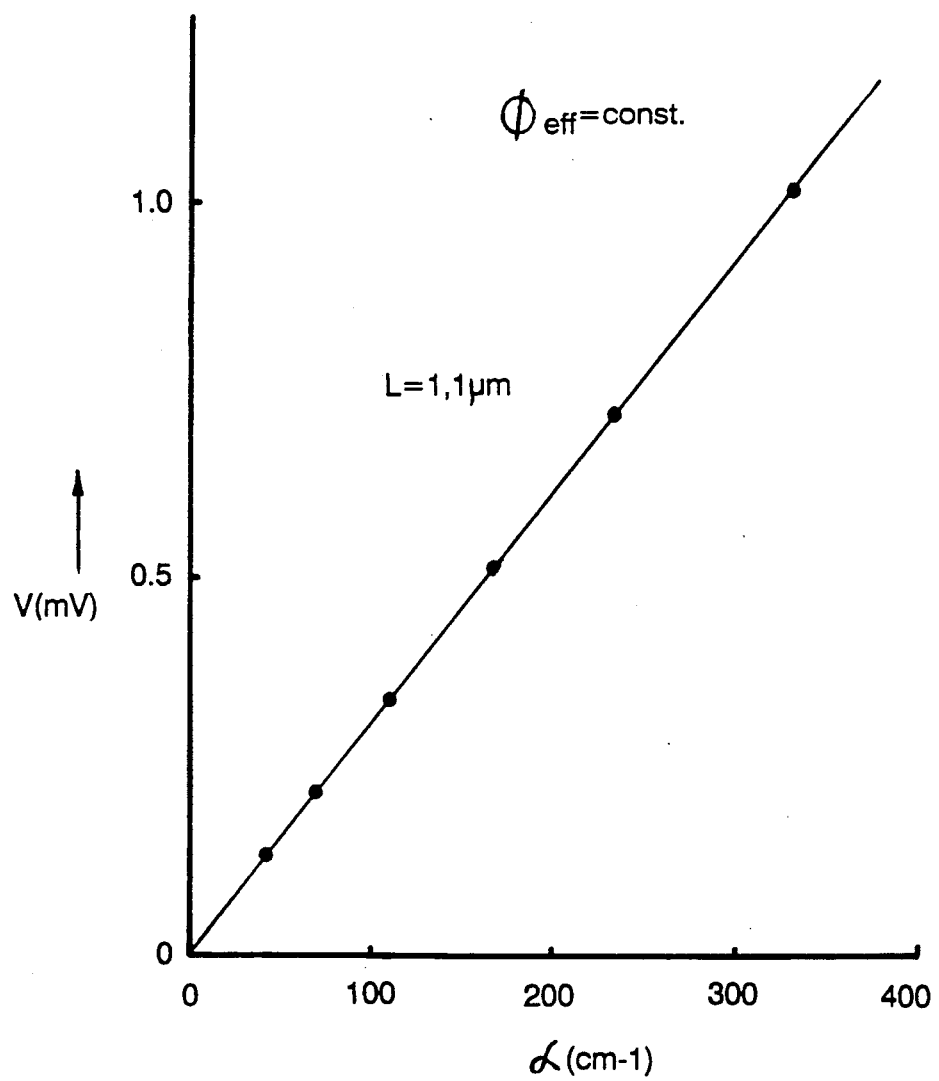
FIG. 3 is a plot of photovoltage versus absorption coefficient for a semiconductor sample of known, very short diffusion length according to the invention.

From relation (7) it is apparent that for small values of the diffusion length L or, $\alpha$L<<1, the photovoltage is a linear function of the absorption coefficient. A plot of photovoltage versus absorption coefficient for such a case for an N-type FZ-silicon sample with a short diffusion length (due to contamination) L=1.1 $\mu$m, is shown in FIG. 3. As can be seen all points fall on the linear plot indicating that the photon flux is indeed constant and its value has been properly selected such that photovoltage is a linear function of flux and that the correct values of the absorption coefficients, $\alpha$, have been used. If measured points were to fall off the line, errors in the calculation of the diffusion length L due to improper selection of the photon flux or the absorption coefficients might arise. Thus, a method is provided to check the selected value of the photon flux and absorption coefficients by measuring the photovoltage versus absorption coefficient for a semiconductor sample of known, short diffusion length prior to (or after) measurements are made on an unknown semiconductor sample.

Figure 4:
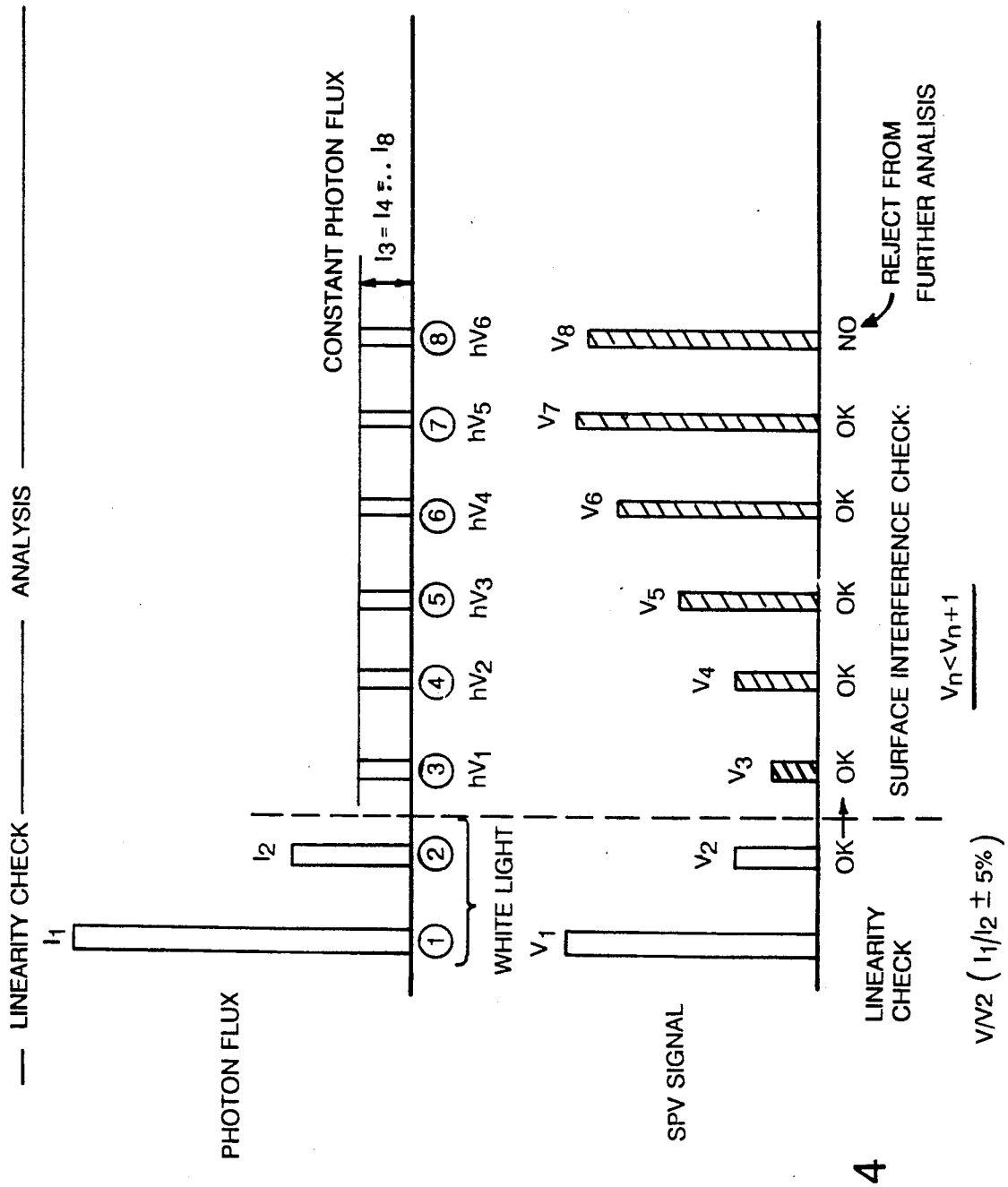
FIG. 4 is a schematic of the procedure of the method of invention.

Referring now to FIG. 4, a preferred procedure of the method of the invention will be described in more detail. Prior to the photovoltage measurement for determination of diffusion length L, white light at two different photon fluxes $\phi_1$, and $\phi_2$ is impinged upon the sample surface and photovoltages V$_1$ and V$_2$ are measured. If the ratio of V$_1$/V$_2$ is substantially equal to the ratio $\phi_1$/$\phi_2$ (within, for example, 5%), the relationship between photovoltage and photon flux $\phi$ is considered to be in the linear region indicated on Fig 1b. If the immediately above mentioned equality is not valid, then the incident white light beam may be attenuated and the measurement repeated. The benefit of using white light for the linearity measurement is that all the analytical wavelengths to be used in the determination of L are contained within the beam. Therefore, effects on linearity which may be particular to a given wavelength are effectively accounted for.

If the intensity is within the linear range, then the wafer is successively illuminated with light of several photon energies $h\gamma_3...h\gamma_8$, with energy increasing i.e. $h\gamma_3...<h\gamma_4<h\gamma_5<h\gamma_6<h\gamma_7<h\gamma_8$ and with the effective photon flux of each being the same constant. The photon flux value selected is lower than the lower white light test flux $\phi_2$ to assure the photovoltages $V_3$ - $V_8$ are in linear range. Before calculation of the diffusion length, the photovoltages are analyzed to assure that each measured voltage is greater than the previously measured. In the event that this relation does not hold as for example for $V_5$ in FIG. 1a and FIG. 4 which could be caused by surface effects, these voltages are excepted from calculation of diffusion length, L.

Referring now to FIG. 5, a preferred embodiment for an apparatus for the minority carrier diffusion length measurement of a silicon wafer according to the present invention is shown to comprise an optical source 10 for producing radiation to be impinged upon a wafer 11 held at a measuring station 12, an electronic system 14 which includes a lock-in amplifier 48 to measure individual photovoltages, and a data processing station 16 for the purpose of carrying out various computations including the calculation of minority carrier diffusion length and the semiconductor contamination factor, and optionally for controlling the measuring system.

The optical system 10 preferably employs a quartz halogen bulb 18 held in a source housing 20. Radiation produced by the bulb is focused and passed first through a rotating chopper 22, held within the source housing 20 and operated of a selected frequency in the range between 5-100 HZ. Following the chopper is the light intensity attenuator, an iris diaphram 26 and a graduated variable neutral density filter 28, held in an assembly 23. The attenuator is adjustable for increasing or decreasing light intensity in the linearity measurement procedure to be described below.

After passing through the filters, the attenuated beam is focused onto a first glass fiber optical cable 30 which is coupled to the filter assembly 23 by means of well known cable mounts. The cable 30 brings radiation from the source, modulated by the chopper to a filter wheel 36 which 16 may be used for wavelength selection. Each filter in the filter wheel consists of a narrow band pass filter and a customized set of neutral density filters, the former assuring the monochromatic light and the latter being used to achieve a constant photon flux $\phi_{eff}$=const.

After passage through a filter of the filter wheel 36, the beam which may be substantially monochromatic in the case of a photovoltage measurement for determining minority carrier diffusion length is coupled to a fiber optical cable 38 which directs the radiation toward the measuring stage 12. The use of the fiber optical cables in this preferred embodiment provides a particular advantage of the apparatus in that the system need not be entirely shaded from ambient light which might otherwise cause measurement errors or increased noise in conventional open optic designs.

At the stage 12, the light incident upon the wafer 11 generates a photovoltage which is detected by the probe 67 and coupled to a lock in amplifier 48 in the electronic system 14 via link 50. The electronic system further includes a control for the light source chopper which provides a reference signal for the lock-in 48 via link 58.

Continuing to refer to FIG. 5, the front view of the filter wheel 36 is provided and shown to include eight filters labeled 1-8 which may be selectively positioned in the radiation path of the optical cable 30, by turning the knob 62. Two filters for use in the linearity check, for example, 1 and 2 transmit white light and have an intensity ratio of $I_1/I_2=2.00\pm0.05$. Filters 3-8 are composed of the narrow band (half width, e.g., $\leq0.01$ ev) pass interference filters that transmit monochromatic radiation and the customized neutral density filters which assure a similar photon flux within $\pm2\%$ for use in minority carrier diffusion length measurements. An example of a set of filter characteristics for the measurement of diffusion length L in silicon wafers are given in Table I below:

TABLE I

| Wheel Position | Photon Energy | Output Effective Photon Flux (arb. units) |
|---|---|---|
| 3 | 1.210 | 1.00 |
| 4 | 1.240 | 0.98 |
| 5 | 1.269 | 1.02 |
| 6 | 1.303 | 1.00 |
| 7 | 1.340 | 0.99 |
| 8 | 1.380 | 1.01 |

The measuring station 12 provides rotary motion ($\delta$) in the wafer plane by means of, for example, a rotary positioner which supports the wafer 11. The wafer 11 itself is mounted on an electrically grounded aluminum base 88. The rotary positioner 64 is in turn supported on stage which allows linear motion in the wafer plane in the direction of the arrow X. The stage further includes a probe 66 which accepts the optical cable 38 for directing the radiation to the wafer surface and detects the induced photovoltage. The probe may be supported on a vertical positioner which allows raising and lowering the probe in the Z direction as indicated by the arrow.

The preferred procedure in the apparatus described above for measurement of minority carrier diffusion length includes confirming the linearity of the photovoltage as a function of the light intensity and then measuring the photovoltage for the six different photon energies with the effective photon flux of the radiation from each being constant and in the linear range. Finally, calculation of the minority carrier lifetime, diffusion length and/or contamination factor may be made using the preceding measurement of photovoltage at the various wavelengths, by plotting the photovoltage as a function of the reciprocal absorption coefficient at the given wavelengths and extrapolating the plot to the X axis as described earlier with respect to FIG. 1a.

A wafer, properly treated (e.g. by removal of an oxide layer in BHF for p-type wafers or for N-type wafer in addition, submerging for 1 to 2 minutes in $K_2$ $Mn$ $O_3$ or boiling in deionized water for 15-45 minutes to stabilize the surface barrier height) is placed on the stage support and the probe 66 lowered such that of the probe electrode is flush upon the wafer. The filter wheel 36 should be adjusted to position 1, the first filter for linearity check. After adjusting the lock-in 48 to be in phase with the chopped signal, the attenuator is adjusted to reduce the magnitude of the photovoltage The photovoltage reading $V_1$ corresponding to position 1 is noted and the filter wheel moved to position 2 and the photovoltage $V_2$ measured and recorded. The intensity ratio of the white light transmitted by these filters is, as mentioned $I_1/I_2 = 2.00 \pm 0.05$. Photovoltages $V_1$ and $V_2$ are then introduced to the computer 16 and the linearity test is passed if:

$$1.95 \lesssim V_1/V_2 \lesssim 2.05$$

If the voltage ratio is not within this range, the attenuator may be further adjusted to decrease the intensity of the incident radiation and the values of $V_1$ and $V_2$ remeasured.

For photovoltage measurements to determine the diffusion length, the filter wheel is successively moved to positions 3 to 8 and the resulting photovoltage values are measured and recorded.

For calculation of the carrier diffusion length L in this embodiment, this procedure may use 2, 3, 4, 5, or 6 data points depending on the following conditions:

If $V_3 < V_4 < V_5 < V_6 < V_7 < V_8$ then all 6 points are used for data processing. However, if $V_8$ is affected by surface effects then:
$V_3 < V_4 < V_5 < V_6 < V_7 > V_8$ and the system rejects Va and uses 5 points for data processing. If $V_7$ and $V_8$ are both affected by surface recombination effects then:
$V_3 < V_4 < V_5 < V_6 > V_7 > V_8$, and the system rejects $V_7$ and $V_8$ and uses the remaining 4 points for data processing.

It should be evident to those skilled in the art that this is but one preferred embodiment for rejection of photovoltage data affected by surface effects. Other more sophisticated algorithms could be implemented without departing from the scope of the present invention.

Using the valid points, voltages according to the above criterion, a least squares fit of reciprocal photovoltage reciprocal $1/V$ as a function of the inverse of the absorption coefficient is performed and the intercept determined and reported as the diffusion length.

The minority carrier lifetimes ($\tau$) may also be calculated for holes in N-type silicon and electrons in P-type silicon using expression (1) and known values of the electron and hole mobilities $\mu_n$ and $\mu_p$, respectively. Approximate expressions corresponding to room temperature measurements are:

$$\text{for electrons } \tau_n = 0.5 \times L^2 \times 10^{-3} \, \mu s$$

$$\text{for holes } \tau_p = 1 \times L^2 \times 10^{-3} \, \mu s$$

where L is in micrometers

The contamination factor (F) provides a measure of the relative increase of the concentration of recombination centers (contaminants) with respect to a reference wafer. For calculation of the contamination factor, a value for $L_{ref}$ in clean (not contaminated) wafer may be used. The contamination factor F is then given by:

$$F = (L_{ref}/L)^2 - 1$$

Another aspect of the invention provides a probe which permits the measurements of SPV to be made with the bulk of the sample exposed to ambient light by shading of only that region of the semiconductor sample upon which the beam is incident.

Referring now to FIGS. 6a and 6b a detailed cutaway view of the probe positioned just above the wafer surface and upon the wafer surface as it would be during a photovoltage measurement are shown, respectively. The probe body is constructed from a material such as a dark plastic which is not transparent to light and comprises a first aperture 68 for receiving the fiber optic cable which may be attached sealably or via common couplers and a second aperture 70 disposed opposite the first aperture for vertical direction of the provided radiation. The second aperture 70 defines the photovoltage probing spot on the wafer and the probing area $\Delta S$ is approximately equal to the cross-sectional area of this aperture. Preferably, between the first and second apertures and beyond the point at which the fiber optic cable terminates in the probe body, a lens 90 is provided for forming uniform beam of radiation through the second aperture 70. About the second aperture, a base region 72 is provided which is of substantially greater outside diameter than the aperture 70, for example, the outer diameter of the base 72 is preferably about 25 mm, $T_1$, while the diameter of the aperture 70 is about 2 mm, $T_2$.

The probe is further provided with a semi-transparent, flexible foil photovoltage pickup electrode 74 formed from a transparent plastic film positioned across the second aperture 70 with a conducting surface of, for example, a layer of indium-tin oxide that faces the wafer as shown in greater detail in FIG. 6c. An alternative to the indium-tin oxide coating, a thin metal transparent film could be used with a dielectric spacer facing the wafer as is known in the art.

The electrode is anchored to the base 72 at anchoring region 76 at a first end and slidably fit into a clear slot 78 in the base at a second end. The electrode is flexibly tensioned by its configuration about the base such that it extends beyond the base itself when the probe is not in contact with the wafer as shown in FIG. 6a. The probe base further provides a cutout region 80 about the second aperture where the electrode extends therefrom. The conducting indium tin oxide, layer on the electrode is connected to the lock in (via link 50 in FIG. 5) which is connected near the anchoring region 76.

Before photovoltage measurements, the probe 66 is lowered to the wafer surface by means of adjustment of a vertical positioner. Upon coming in contact with the surface, electrode 74 slides into slot 78 until the base surface 84 is flush upon the wafer and the electrode 74 is contained within the cutout region 80 as shown in FIG. 4b.

During photovoltage measurement, the modulated radiation is directed through the electrode to the wafer surface where a photovoltage is induced and measured by the electrode. Because the width of the base 84 is flush against the wafer surface which is much larger than the wafer area imaged by the beam and measured by the pickup electrode, stray background light is blocked from the surface area interrogated, thereby reducing noise levels in the measurement. This design represents a significant improvement over previous surface photovoltage probes by permitting its use in the thereby avoiding the inconvenience of shading the entire wafer.

Preferably, the probe described with reference to FIG. 6a-6c is employed in the apparatus discussed with reference to FIG. 5. Since the probe effectively blocks ambient radiation from that portion of the wafer being interrogated by the beam and the apparatus of FIG. 5 employs fiber optics for transport of the beam, the measurements are made convenient by allowing operation in ambient light while maintaining low noise level and providing an accurate determination of the diffusion length.

Referring to FIGS. 7 and 7a, a probe is shown for photovoltage measurements in which the probe electrode makes enhanced soft contact with wafer surface. The probe 109 is a light blocking probe having housing 110 which receives at a first end 111 a fiber optic cable 112. The fiber optic cable 112 terminates at a mounting 126 (secured by set-screw 128) within a reciprocating portion 122 of the probe. The fiber optic cable 112 directs a modulated light beam of desired wavelength toward a lens member 114 which focuses the beam through the aperture 116 at the opposite end 118 of the reciprocating portion 122. The aperture 116 and end 118 of the probe are cooperatively constructed such that the end 118 provides substantial blocking of ambient light from the area of the wafer interrogated by the beam passing through the aperture 116. Across the aperture 116 is a flexible, partially transparent electrode 118, biased as previously described between an anchor slot 152 and a clear slot 153 to provide soft contact to the wafer surface. The probe further includes a spring member 120 (light tension, for example, 100 gm/cm) which biases the reciprocating member 122 with respect to the housing 110 so that the end 118 of the probe reciprocates within the housing as it engages the wafer for soft, gradual contact upon the wafer surface as the probe is lowered to the surface of the wafer by a positioner (not shown) attached to bracket 113, fixed to the probe housing 110. An electrical cable 124 connects to the electrode 119 to analysis means for analysis of the photoinduced signals detected by the electrode 119. Referring to FIG. 7c, the electrode 119 may be connected to the cable 124 by a piece of aluminum foil 150 which is formed to fit snugly about a portion of the electrode disposed in anchored slot 152. The housing and reciprocating member are preferably formed of a nonreflective material, e.g., Dalrin ®.

As discussed, light-blocking probes advantageously block stray light from the portion of the wafer interrogated by the modulated radiation. Because the probe carries the light blocking element and is preferably small compared to the wafer surface (FIG. 5), the wafer may be interrogated at various positions on the surface by moving the probe or the wafer. The probe may be used in the presence of ambient light and the inconvenience of shading the entire wafer is avoided.

Referring to FIGS. 8–11, light blocking probes are illustrated in use in noncontact modes of measurement of photoinduced electrical properties, in which the wafer and probe are positioned such that the wafer is positioned above and not in physical contact with the wafer chuck by a nonconductive support and/or the probe electrode is positioned above, and not in physical contact with the wafer surface. Such noncontact methods are advantageously employed for measurement of production wafers moved between processing stations with robotic arms and with which contact must be minimized to avoid contamination.

Referring to FIG. 8, measurement of photoinduced electrical properties of a semiconductor wafer 100 is illustrated without contact of the back surface 101 of the wafer to the electrically conductive chuck 102 and with contact of the probe 109 to the front wafer surface 103. The wafer 100 is supported at several positions (e.g., three) on its periphery above a conducting wafer chuck 102 on teflon supports 106 (coupling between the wafer and chuck remains capacitive). The gap $G_1$ between the wafer back surface 101 and the chuck is about 0.5 to 1.0 mm. To limit the reflection of ambient light by the chuck which might be reflected on the wafer and effect the signal, the chuck has a light absorbing coating 104 which may be provided by adonizing the surface of, for example, an aluminum chuck or may be provided by black paint. (Alternatively, the wafer support may be an annular support at the wafer periphery which blocks stray light from the gap.) The chuck 104 is connected to ground 107. Photoinduced electrical properties may be measured by means of soft contact light blocking probe 109 in which the signals are detected by a semi-transparent conducting electrode in contact with the wafer surface as discussed above. A positioner 170 allows the relative vertical position between the wafer and probe to be adjusted for soft gradual contact of the probe on the wafer front surface.

Referring now to FIG. 9, measurement of photoinduced electrical properties without contact of the light-blocking probe to the wafer front surface or the chuck to the wafer back surface is illustrated. The light-blocking probe is positioned, by a positioner 170, above the front surface 103 of the wafer 100 to create a gap $G_2$ typically about 0.1–0.5 mm. (The coupling between the probe electrode and the wafer remains capacitive). The wafer 100 is positioned above the wafer chuck 102 to provide a gap $G_1$ by supporting the wafer on teflon supports 106, as described.

Referring to FIG. 10, the light blocking probe for use in the measurement mode of FIG. 9 may include a rigid semi-transparent electrode 140 which may be a glass or quartz disk shaped member having a conducting ITO film, for example, or a thin semi-transparent nickel film on the face 142 opposite the wafer. As shown the electrode 140 fits into an aperture in the end of the probe. The electrode further includes a conducting film on the sides 144, connected to the film on face 142 for convenient contact with cable 124 to record photo-induced electrical properties from an illuminated wafer surface (FIG. 10a). The electrode 140 may be flush or slightly recessed within the aperture through which light passes to the wafer surface.

During measurement, neither the electrode 140 nor the light-blocking end 150 of the probe contact the wafer surface but the probe is sufficiently close to the wafer and is cooperatively dimensioned with respect to the aperture for the modulated beam to provide light-blocking of stray background light from reaching the area interrogated by the modulated beam under the electrode 140. Preferably, the width $W_1$ of the end 150 of the probe is about three or more times the width $W_2$ of the aperture for passage of the modulated beam. The width of the probe end 150 is, for example, about 1 inch while the aperture may be about 0.25 to 0.125 inch in width. The gap $G_2$ is preferably two times electrode width or less. The width of the focused beam impinging upon the wafer surface is substantially equal to the width of the aperture (or electrode) at typical gap heights.

Figure 11:
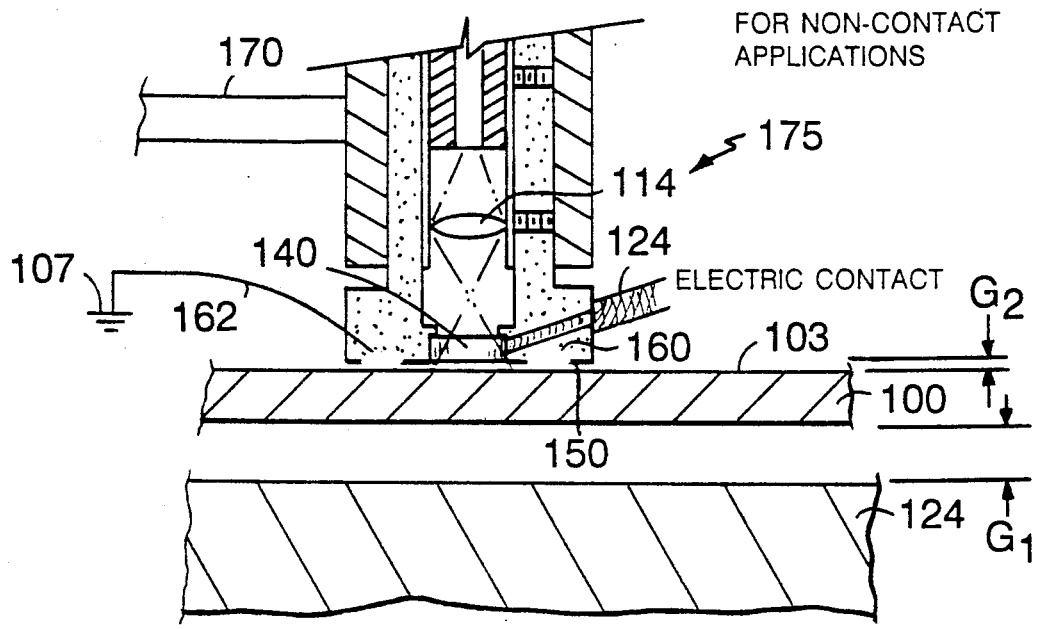
FIG. 11 is a cross-section side view of light blocking probe including a ground electrode facing the wafer.
Figure 11A:
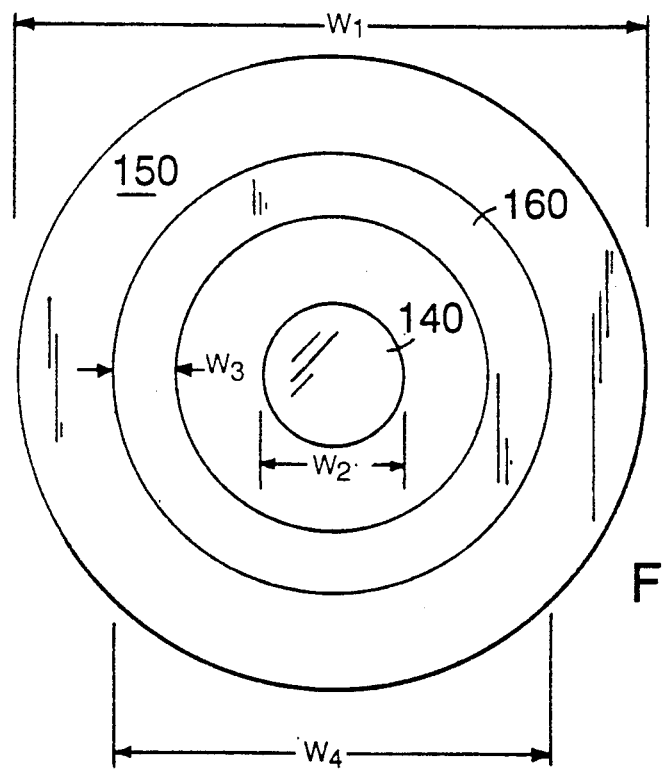
FIG. 11a is an end-on view of the portion of the light blocking probe in FIG. 11 that faces the wafer.

Referring to FIGS. 11 and 11a, a light blocking probe 175 for measurement of photoinduced electrical properties preferably without contact to the surface 103 of the wafer 100 is shown to include, in addition to electrode 140, an annular ground electrode 160 concentrically arranged about the electrode 140. The annular electrode 160 is connected by a wire 162 to ground 107. The wafer 100 may be supported above a wafer chuck 164 which, in this embodiment, need not be connected to ground nor even be of a conducting material. For example, the chuck could be a robotic arm employed in a wafer processing apparatus that moves wafers between processing stations. Instead, capacitive coupling occurs between the grounded annular electrode 160 and the region of the wafer surface 103 which the annular electrode faces. The light blocking nature of the probe limits illumination of the area beneath the annular electrode 160 from stray light, as well as from beneath the probe electrode 140. In general, the probe and electrodes may be dimensioned and positioned above the wafer as described above. The width $W_3$ of the annular electrode 160 is generally selected such that the surface area of the annular electrode is approximately 10 times the surface area of the transparent electrode 140. Typically, the surface area provided by the annular electrode is about 100–500 mm², depending on the size of the transparent electrode. The preferred embodiment for measurement of wafers having a diameter of 4 to 8 inches, has the following dimensions:

| |
|---|
| $W_1$ = 1.25 inch |
| $W_2$ = 0.25 inch |
| $W_3$ = 0.3 inch |
| $W_4$ = 1.0 inch |

Figure 12:
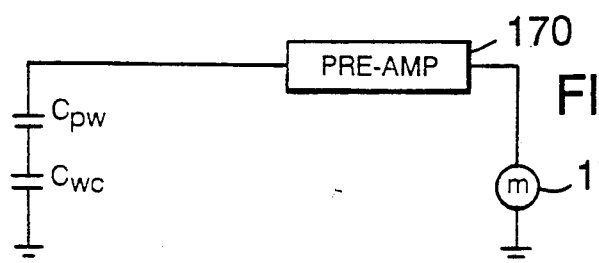
FIG. 12 illustrates the circuit for measurement of photoinduced electrical properties.

The circuit for measurement of the photoinduced electrical properties is schematically illustrated in FIG. 12 to include capacitive coupling between the wafer and probe, $C_{wp}$, and wafer and chuck, $C_{wc}$, in series. A preamp 170 amplifies the detected signal delivered to a meter 172. For measurement in the noncontact modes discussed above, the capacitance between probe and wafer, $C_{pw}$, must be much smaller than the capacitance between the wafer and chuck, $C_{wc}$. In general, this is satisfied when:

$$(S_p/d_{pw}) << (S_w/d_{wc}) \quad (10)$$

where:
$S_p$—probe surface area
$d_{pw}$—gap distance between probe and wafer
$S_w$—surface area of the wafer
$d_{wc}$—gap distance between wafer and chuck Typically, this is satisfied as shown in the following example:

| | |
|---|---|
| Typically: | $S_p$ is 1 to 10 mm² |
| | $d_{pw}$ is 0.1 to 0.5 mm, therefore, |
| | $(S_p/d_{pw})$ is from 0.2 to 100 mm |
| while | |
| Typically: | $S_w$ is $10^4$ to $10^5$ mm² |
| | $d_{wc}$ is 0.5 to 1 mm, and |
| | $(S_w/d_{wc})$ is from $1 \times 10^4$ to $2 \times 10^5$. |

Preferably, $(S_w/d_{pw})$ is about at least one order of magnitude greater, e.g., three orders of magnitude greater than $(S_p/d_{pw})$.

It will be understood that in the case of a probe as in FIG. 11, which carries a ground electrode, the $C_{wc}$ is replaced by the capacitance between the wafer surface and ground electrode. In this case, equation (10) above, $S_w$ is replaced by $S_o$, the surface area of the ground electrode and $d_{wc}$ is replaced by $d_{pw}$. Equation (10) simplifies to $$S_p << S_G \quad (11).$$

As discussed, the area of the ground electrode is preferably about ten times the area of the semi-transparent probe electrode.

Other embodiments are possible. For example, it will be understood that the probes described in FIG. 10 may also be used in an arrangement with the wafer in contact with a chuck. The probes as described in FIGS. 10 and 11 could be measured with the probe in a contact with the wafer. The probe in FIG. 7 could be used in non-contact modes as discussed with respect to FIG. 9. The relative vertical position of the probe and the wafer may be adjusted by either adjustment of the probe height, as shown, or adjustment of the vertical wafer position, or both adjustment of probe and wafer position. The measurement made may be either photovoltage or photocapacitance. Probes of various dimensions are possible. For example, such smaller transparent electrodes, e.g. 1 mm in width, may be advantageous in some applications. The measurement may be made by analysis of a transient photoinduced electrical signal produced by interruption of the illumination of the wafer.

Other embodiments are within the following claims.

What is claimed is:

1. A device for measuring electrical properties of a semiconductor sample, comprising:
   an analysis probe for directing a light beam to a defined portion of a semiconductor substrate surface, said probe including:
      a probe electrode for detecting a photo-induced electrical signal from said defined portion of said semiconductor substrate, and
      a light blocking means, carried by said probe for substantially blocking stray light from said defined portion of said substrate surface during said detecting, and
   said device further including a positioning means of relative positioning of said semiconductor substrate and probe for measurement of said electrical property at a desired defined portion of said semiconductor substrate surface.

2. The device of claim 1 wherein said positioning means is adapted to position respectively said semiconductor substrate and probe for measurement without contact between said wafer and probe.

3. The device of claim 1 or 2 further including a supporting chuck for said semiconductor substrate and a nonconductive chuck positioner adapted to position said semiconductor substrate with respect to said chuck without contacting said chuck.

4. The device of claim 3 wherein the capacitance between the probe and semiconductor substrate, $D_{pw}$ is much less than the capacitance between the semiconductor substrate and chuck, $C_{wc}$.

5. The apparatus of claim 4 wherein $C_{pw}$ is at least one order of magnitude smaller than $C_{wc}$.

6. The device of claim 2 wherein said probe includes a ground electrode adapted to face and capacitively couple to said substrate surface.

7. The device of claim 6 wherein the surface area of said ground electrode is about 10 times or more greater than the surface area of said probe electrode.

8. The device of claim 6 including a supporting member that is nonconducting.

9. The device of claim 3 wherein said semiconductor substrate is positioned above a chuck having a light absorbing surface.

10. The device of claim 1 wherein said light blocking means comprises a light blocking surface adjacent said semiconductor substrate surface and said light blocking surface is substantially smaller than said substrate.

11. The device of claim 10 wherein the light blocking surface adjacent said semiconductor substrate disposed with respect to said light beam produced by said probe.

12. The device of claim 11 wherein the width of said light blocking surface is at least about three times the width of said light beam impinged upon the surface of said substrate.

13. The device of claim 12 wherein said positioning means is adapted to position respectively said semiconductor substrate and probe without contact between said wafer and probe and the position of said probe above said wafer is less than about 2 times or less than the width of said light beam impinged upon the surface.

14. The device of claim 2 or 11 wherein said beam directed by said probe passes through said probe electrode which is semi-transparent to said beam and comprises a rigid dielectric member having a conductive coating facing said semiconductor substrate.

15. The device of claim 14 wherein said dielectric member is quartz.

16. The device of claim 1 further comprising a biased housing for soft contact of said probe to said semiconductor substrate surface.

17. The device of claim 6 wherein the following condition is satisfied:

$$S_p << S_G$$

where $S_p$ is the probe electrode surface area and $S_G$ is the ground electrode surface area.

18. The device of claim 17 wherein the surface area of said ground electrode is about 10 times or more greater than the surface area of said probe electrode.

19. The device of claim 18 including a supporting member for said substrate that is nonconducting.

20. The device of claim 19 wherein said light blocking means comprises a light blocking surface adjacent said semiconductor substrate and said light blocking surface is substantially smaller than said substrate.

21. The device of claim 20 wherein the light blocking surface adjacent said semiconductor substrate is symmetrically disposed with respect to said light beam produced by said probe.

22. The device of claim 21 wherein the width of said light blocking surface is at least three times the width of said light beam impinged upon the surface of said substrate.

23. The device of claim 22 wherein said positioning means is adapted to position respectively said semiconductor substrate and probe without contact between said wafer and probe and the position of said probe above said wafer is about 2 times or less than the width of said light beam impinged upon the surface.

24. The device of any one of claims 1, 2, 6, 11, 17 or 23 wherein said probe electrode is semi-transparent to said beam directed by said probe and said beam directed by said probe passes through said probe electrode.

25. A method for measurement of electrical properties of a semiconductor sample, comprising:
providing an analysis probe for directing a light beam to a defined portion of a semiconductor substrate surface, said probe including a probe electrode for detecting a photo-induced electrical signal from said defined portion of said semiconductor substrate surface, and a light blocking means, carried by said probe for substantially blocking stray light from said defined portion of said substrate surface during said detecting, and
relatively positioning said semiconductor and probe for measurement of said electrical property at a desired defined portion of said semiconductor substrate surface.

26. The method of claim 25 wherein said positioning comprising positioning respectively said semiconductor substrate and probe without contact between said wafer and probe.

27. The method of claim 26 wherein said positioning comprises positioning said semiconductor substrate with respect to a chuck without contacting said chuck.

28. The method of claim 27 comprising constructing said probe and positioning said probe and semiconductor substrate such that the capacitance between the probe and semiconductor substrate, $C_{pw}$, is much less than the capacitance between the semiconductor substrate and chuck, $C_{wc}$.

29. The method of claim 25 including constructing said probe to include a ground electrode adapted to face said substrate surface, and using a nonconducting support for said substrate.

* * * * *

UNITED STATES PATENT AND TRADEMARK OFFICE
CERTIFICATE OF CORRECTION

PATENT NO. : 5,177,351
DATED : 01/05/93
INVENTOR(S) : Jacek J. Lagowski

It is certified that error appears in the above-identified patent and that said Letters Patent is hereby corrected as shown below:

Col. 2, line 64; "h>Eg." should be --$h_v > E_g$.--.

Col. 3, line 11; "0," should be --$\alpha$,--.

Col. 3, line 68; "($S_p/d_{pw} << S_w/d_{wc}$) should be --($S_p/d_{pw}$) << ($S_w/d_{wc}$)--.

Col. 9, line 9; delete "..." after hγ3".

Col. 9, line 17; "$V_s$" should be --$V_8$--.

Col. 16, line 53; "$D_{pw}$" should be --$C_{pw}$--.

Col. 17, line 6; insert --is symmetrically-- after "substrate".

Signed and Sealed this

Fifteenth Day of February, 1994

BRUCE LEHMAN

Attesting Officer   Commissioner of Patents and Trademarks